US012426355B2

(12) United States Patent
Leobandung

(10) Patent No.: US 12,426,355 B2
(45) Date of Patent: Sep. 23, 2025

(54) INTEGRATION OF STACKED NANOSHEETS AND FINFET THAT OVERHANGS A BOTTOM SPACER

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 702 days.

(21) Appl. No.: 17/651,903

(22) Filed: Feb. 22, 2022

(65) Prior Publication Data
US 2023/0268345 A1  Aug. 24, 2023

(51) Int. Cl.
*H10D 84/83* (2025.01)
*H01L 21/02* (2006.01)
*H10D 30/01* (2025.01)
*H10D 30/67* (2025.01)
*H10D 62/10* (2025.01)
(Continued)

(52) U.S. Cl.
CPC ....... *H10D 84/834* (2025.01); *H01L 21/0259* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 64/018* (2025.01); *H10D 84/0128* (2025.01);
(Continued)

(58) Field of Classification Search
CPC .. H01L 21/0259; H10D 30/01; H10D 30/014; H10D 30/017; H10D 30/019–0198; H10D 30/024; H10D 30/031; H10D 30/0312; H10D 30/0318; H10D 30/43; H10D 30/435; H10D 30/501–509; H10D 30/6713; H10D 30/6735; H10D 30/674; H10D 30/6757; H10D 62/118; H10D 62/121; H10D 62/292; H10D 64/017; H10D 64/018; H10D 64/516; H10D 84/01; H10D 84/0128; H10D 84/0158; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 84/834
See application file for complete search history.

(56) References Cited

U.S. PATENT DOCUMENTS 9,647,067 B1   5/2017 Deyuan
10,032,867 B1  7/2018 Yeung
(Continued)

OTHER PUBLICATIONS

From the International Searching Authority, Invitation to Pay Additional Fees and, Where Applicable, Protest Fee, Communication Relating to the Results of the Partial International Search, Date of mailing May 17, 2023, Applicant's or agent's file reference P202100767, International application No. PCT/EP2023/053957, 9 pages.
(Continued)

*Primary Examiner* — Cheung Lee
(74) *Attorney, Agent, or Firm* — Samuel A. Waldbaum

(57) ABSTRACT

A semiconductor device including a first spacer located on top of a substrate, where the first spacer has a first width in a first axis of a nanodevice. At least one fin located on top of the first spacer, where the at least one fin has a second width in the first axis of the nanodevice. Where the second width is larger than the first width.

19 Claims, 14 Drawing Sheets

(51) Int. Cl.
*H10D 64/01* (2025.01)
*H10D 84/01* (2025.01)
*H10D 84/03* (2025.01)

(52) U.S. Cl.
CPC ....... *H10D 84/0158* (2025.01); *H10D 84/038* (2025.01)

(56) References Cited

U.S. PATENT DOCUMENTS

| | | |
|---|---|---|
| 10,297,667 B1 | 5/2019 | Yeung |
| 10,332,803 B1 | 6/2019 | Xie |
| 10,411,090 B2 | 9/2019 | Weber |
| 2015/0311200 A1 | 10/2015 | Yin |
| 2015/0380525 A1 | 12/2015 | Yu |
| 2020/0266271 A1 | 8/2020 | Lin |
| 2021/0126099 A1 | 4/2021 | Young |
| 2021/0233910 A1 | 7/2021 | Yeh |

OTHER PUBLICATIONS

Notification of Transmittal of the International Search Report and the Written Opinion of the International Searching Authority, or the Declaration, Date of mailing Jul. 11, 2023, Applicant's or agent's file reference P202100767, International application No. PCT/EP2023/053957, 17 pages.

Disclosed Anonymously, "Integration of bottom isolated Nanosheet with long channel bulk FinFET", An IP.com Prior Art Database Technical Disclosure, Jun. 14, 2018, IP.com No. IPCOM000254274D, 6 pages.

Zhang et al., "Full Bottom Dielectric Isolation to Enable Stacked Nanosheet Transistor for Low Power and High Performance Applications", 2019 IEEE International Electron Devices Meeting (IEDM), 2019, pp. 11.6.1-11.6.4.

INTEGRATION OF STACKED NANOSHEETS AND FINFET THAT OVERHANGS A BOTTOM SPACER

BACKGROUND

The present invention generally relates to the field of nano devices, and more particularly to formation of the contacts and the preventing the shorting of the contacts.

Nanosheet is the lead device architecture in continuing CMOS scaling. However, nanosheet technology has shown issues when manufacturing a contact to a buried power rail without shorting an adjacent contact.

BRIEF SUMMARY

Additional aspects and/or advantages will be set forth in part in the description which follows and, in part, will be apparent from the description, or may be learned by practice of the invention.

A semiconductor device including a first spacer located on top of a substrate, where the first spacer has a first width in a first axis of a nanodevice. At least one fin located on top of the first spacer, where the at least one fin has a second width in the first axis of the nanodevice. Where the second width is larger than the first width.

A semiconductor device including a first nanodevice comprised of a plurality of nanosheets located on a substrate, where each of the plurality of nanosheets has a first width along a first axis. A second nanodevice comprised of at least one fin located on the substrate, where the at least one fin has a second width along the first axis, and where the second width is larger than the first width.

A method including forming alternating layers of sacrificial material and channel material located on top of a substrate, where a first sacrificial layer is located directly one top of the substrate. Removing the first sacrificial layer and forming a bottom spacer located directly on top of the substrate and below the alternating layers. Etching the alternating layers and the bottom spacer to a first width along a first axis. Removing the alternating layers comprised of the sacrificial material. Epitaxially growing the layers of the alternating layer comprised of the channel material to merger the layers of the alternating layer comprised of the channel material to form a combine fin, where the fin has a second width along the first axis, where the second width is larger than the first width.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1A:
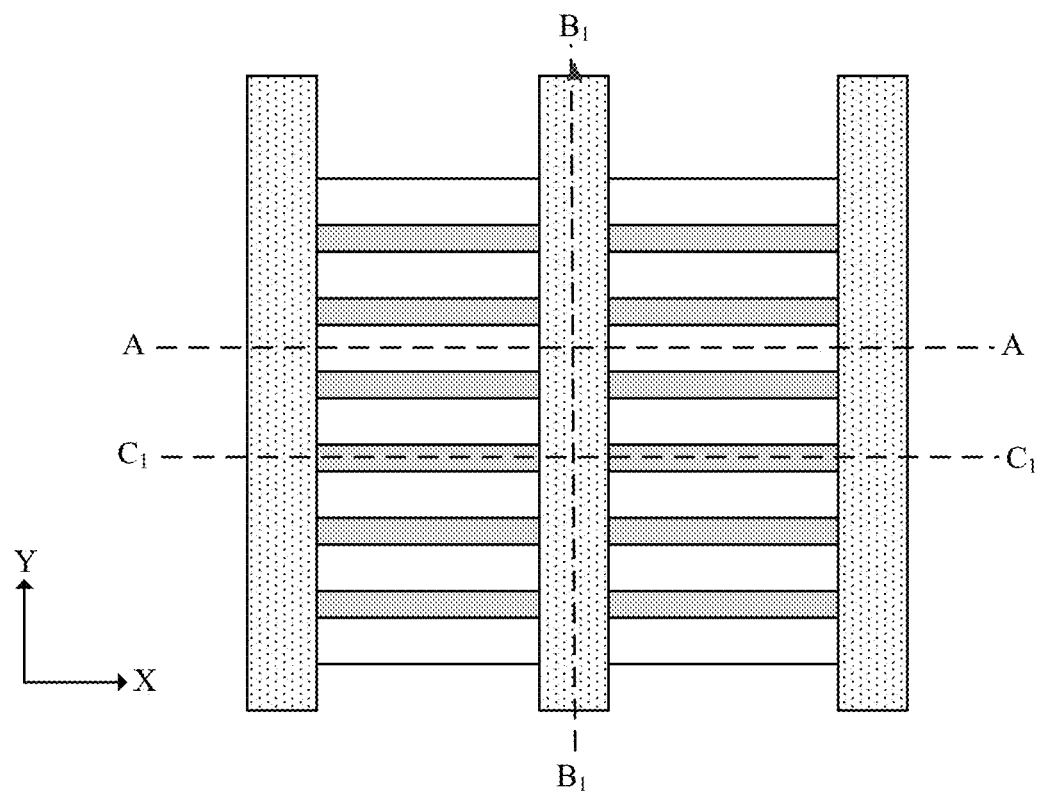
FIGS. 1A and 1B illustrates a top view of two locations containing nano devices on a common substrate, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of +8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. Stack nanowire has been proposed for CMOS scaling due to superior current capability. However, stack nanowire is not beneficial for I/O device, such as thick oxide, because the gap between stacked nanowires restricts the thickness of the oxide. There is an advantage to having both a Nanosheet device and a FIN device on the same wafer, for example, the FINFET can be used as the thick oxide device. The present invention is directed to forming a nanosheet device and a FINFET on the same wafer. Where the nanosheet device and the FINFET are formed out of a common set of starting layers. The fin is manufactured from the nanosheets after the sacrificial layers separating the nanosheets is removed. The space between the nanosheets is filled in by epitaxially adding material to the nanosheets to form a solid fin out of the separate nanosheets. The width of the fin is greater than the width of the nanosheets. The height of the fin is greater than the height of the stacked nanosheets. The present invention allows for the formation of the fin and nanosheets on a common substrate from common starting layers. Furthermore, the present invention allows for the formation of the fin without removing layers to allow for the deposition of new layers to form the fin.

Figure 1B:
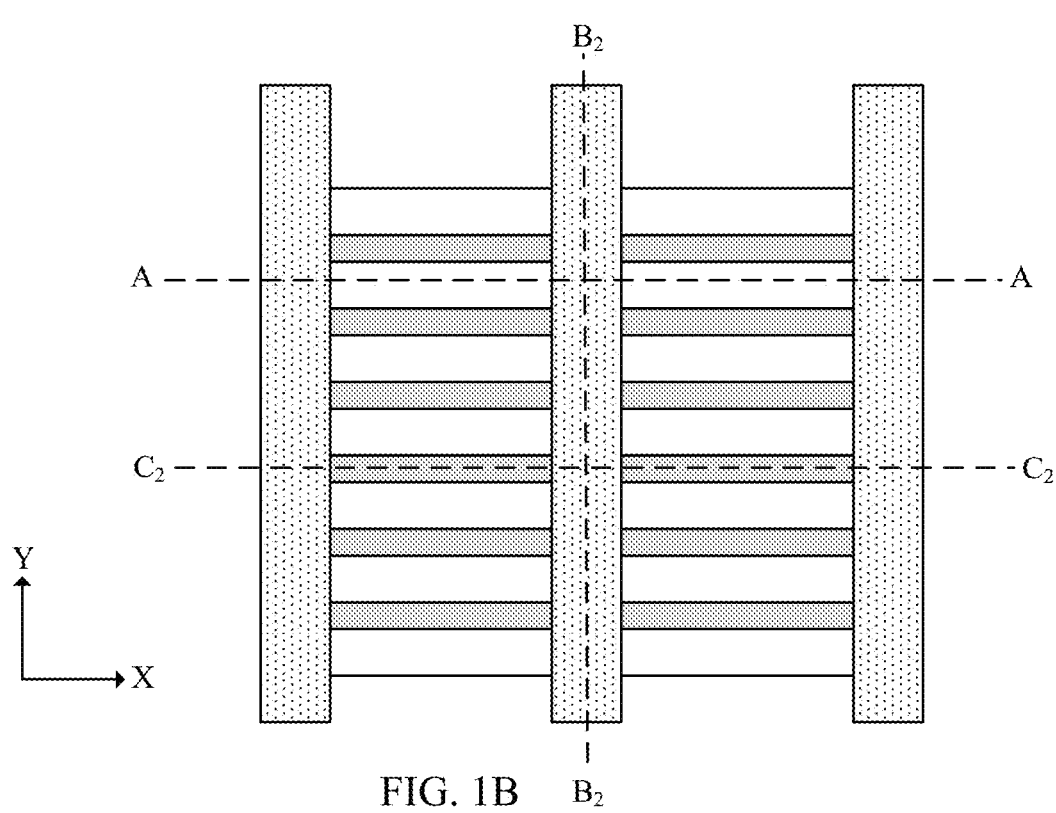

FIGS. 1A and 1B illustrates a top view of two locations containing nano devices on a common substrate, in accordance with the embodiment of the present invention. FIG. 1A represent the finished nanosheet device and the FIG. 1B represents the finished Fin device, where the nanosheet device and the fin devices are located on a common substrate 105. The Fin device and the nanosheet device are located at different points on the common substrate 105. They can be adjacent to each other, spaced apart, and/or have different devices located between them. Cross-sections $B_1$ and $B_2$ of the nanodevices will be along the Y-axis of the devices. Cross-sections $C_1$ and $C_2$ of the nanodevices will be along the X-axis of the devices.

Figure 2:
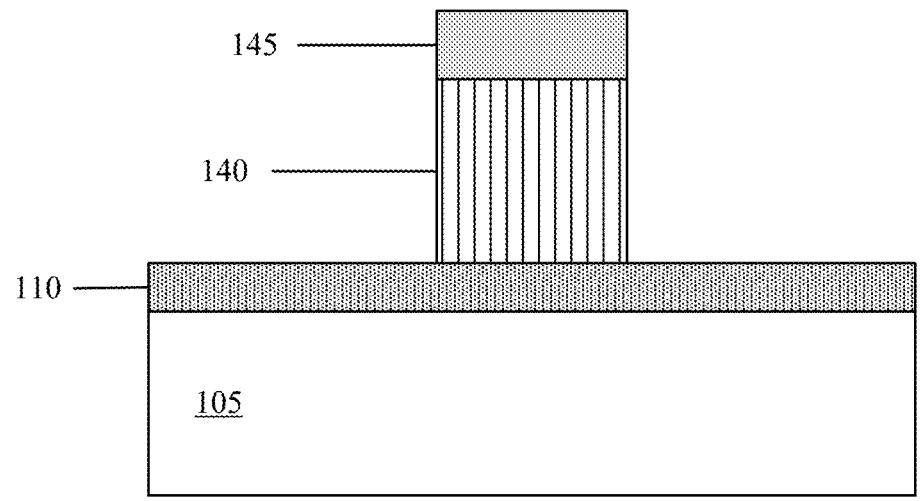
FIG. 2 illustrates cross section A of the nano devices, in accordance with the embodiment of the present invention.

FIG. 2 illustrates cross section A of the nano devices, in accordance with the embodiment of the present invention. Each of the nano devices (nanosheet/fin) have a common starting point that includes a substrate 105, a shallow trench isolation layer 110, a dummy gate 140, and a hard mask 145. The substrate 105 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprised of an amorphous, polycrystalline, or monocrystalline. The semiconductor substrate 105 may be doped, undoped or contain doped regions and undoped regions therein. The shallow trench isolation layer 110 is located on top of the substrate 105. The dummy gate 140 is located on top of the shallow trench isolation layer 110. The dummy gate 140 can be comprised of, for example, amorphous Si or SiGe. The hard mask 145 is located on top of the dummy gate 140. The dummy gate 140 is etched to the desired pattern.

Figure 3:
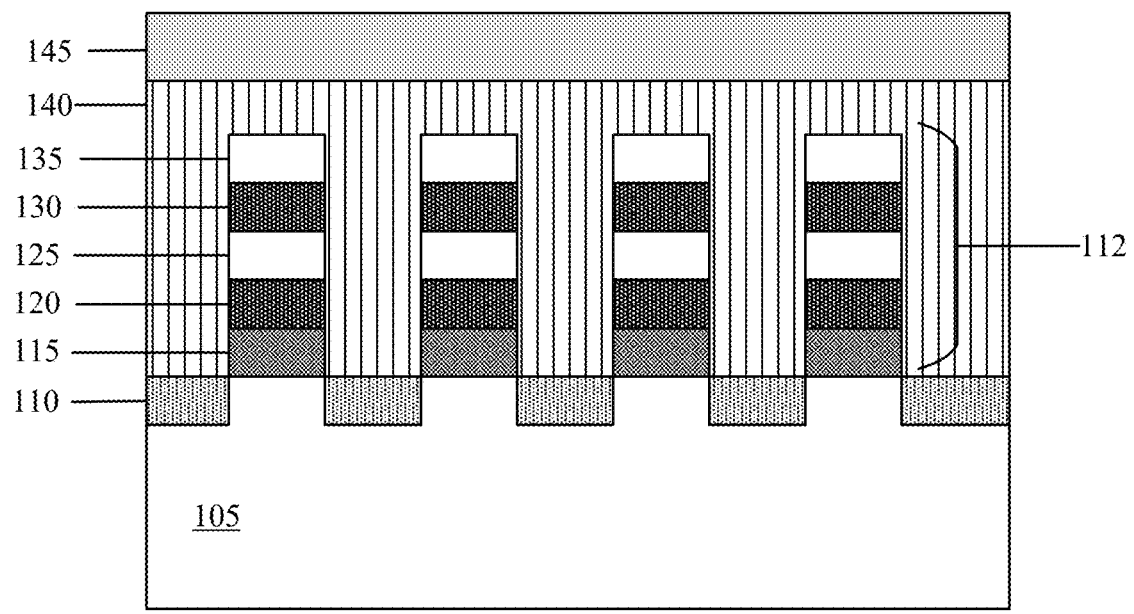
FIG. 3 illustrates cross section $B_1$ and $B_2$ of the nano devices, in accordance with the embodiment of the present invention.
Figure 4:
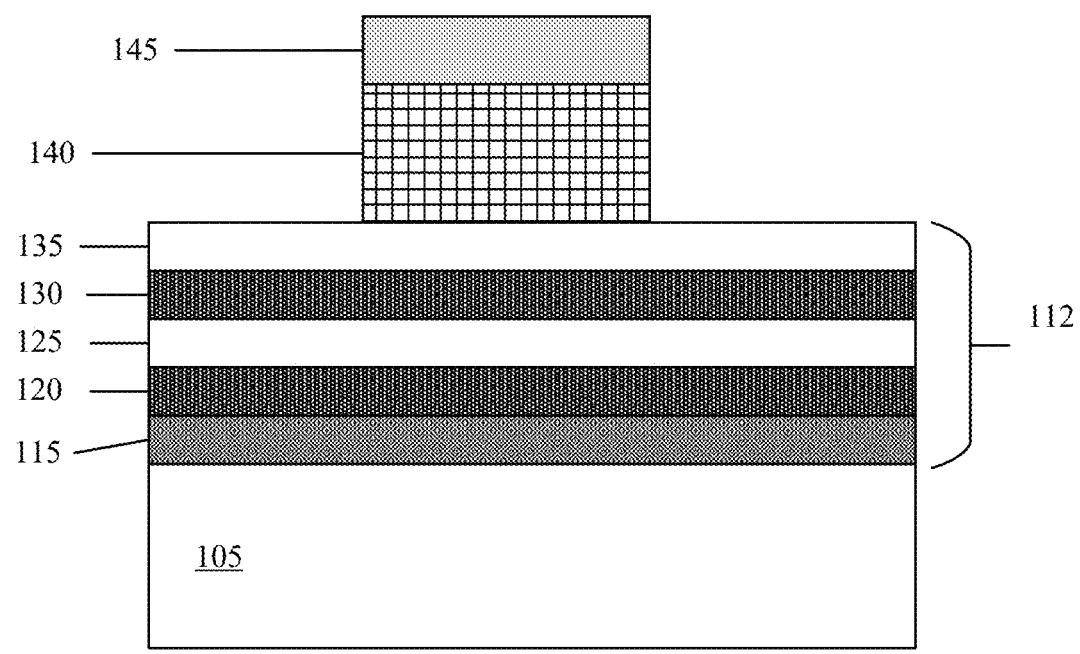
FIG. 4 illustrates cross section $C_1$ and $C_2$ of the nano devices, in accordance with the embodiment of the present invention.

FIG. 3 illustrates cross section $B_1$ and $B_2$ of the nano devices, in accordance with the embodiment of the present invention. FIG. 4 illustrates cross section $C_1$ and $C_2$ of the nano devices, in accordance with the embodiment of the present invention. Each of the nano devices (nanosheet/fin) have a common starting point that includes the substrate 105, the shallow trench isolation layer 110, a nano stack 112, the dummy gate 140, and the hard mask 145. The nano stack 112 is comprised of multiple layers. The nano stack 112 includes a first sacrificial layer 115, a second layer 120, a third layer 125, a fourth layer 130, and a fifth layer 135. The number of layers illustrated are for example purposes only. The first sacrificial layer 115 can be comprised of, for example, SiGe, where Ge is in the range of about 45% to 70%. A second group of sacrificial layers includes the second layer 120, and the fourth layer 130. Each layer of the second group of sacrificial layers can be comprised of, for example, SiGe, where Ge is in the range of about 15% to 35%. The third layer 125 and the fifth layer 135 are nanosheets comprised of, for example, Si. The nano stack 112 is formed in into a plurality of columns. The dummy gate 140 is located around the columns of the nano stack 112 and located on top of the shallow trench isolation layer 110. The hard mask 145 is located on top of the dummy gate 140.

Figure 5:
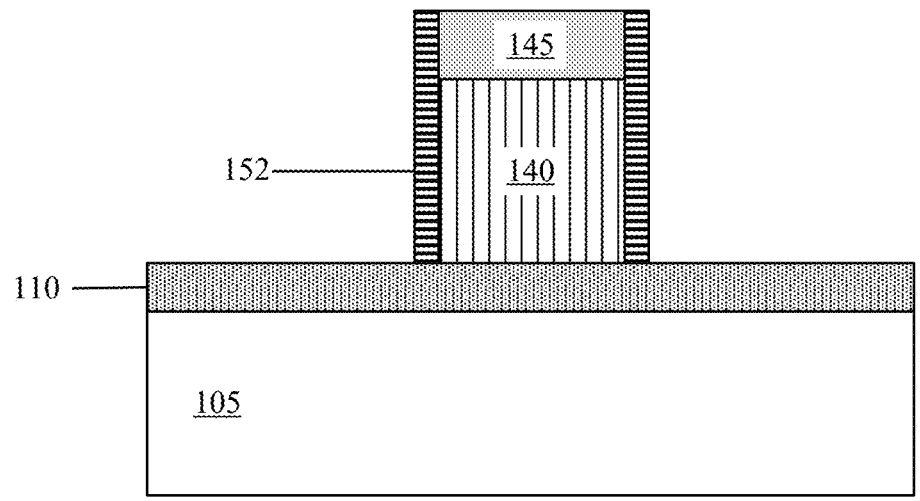
FIG. 5 illustrates cross section A of the nano devices after the formation of upper spacer, in accordance with the embodiment of the present invention.

FIG. 5 illustrates cross section A of the nano devices after the formation of upper spacer 152, in accordance with the embodiment of the present invention. An upper spacer 152 is formed on the exposed surfaces of the shallow trench isolation layer 110, the dummy gate 140, and the hard mask 145. The upper spacer 152 is etched back so that a portion of the upper spacer 152 remains along the sidewalls of the dummy gate 140 and the sidewalls of the hard mask 145.

Figure 6:
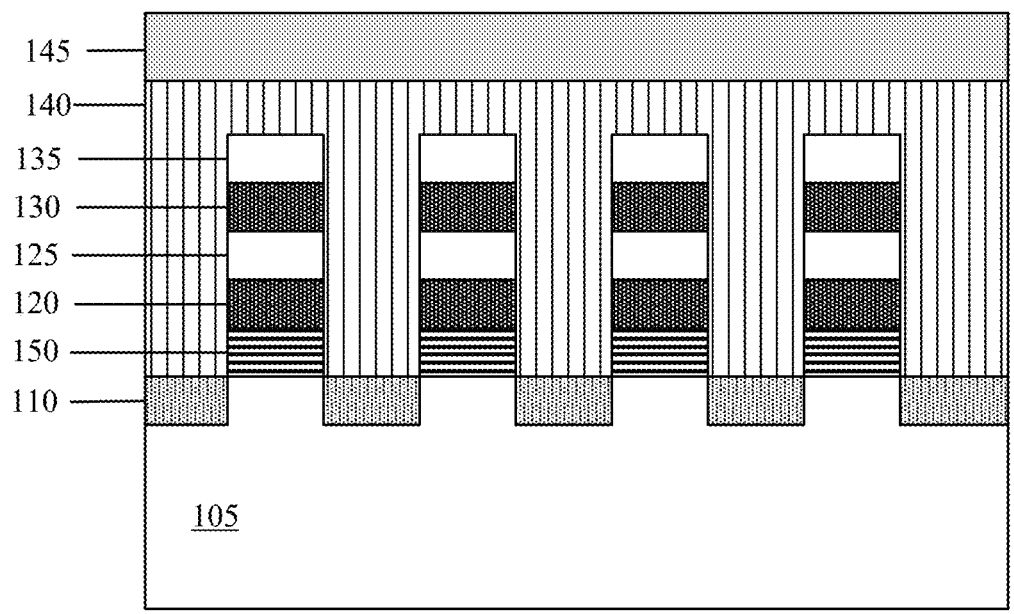
FIG. 6 illustrates cross section $B_1$ and $B_2$ of the nano devices after formation of a lower spacer, in accordance with the embodiment of the present invention.
Figure 7:
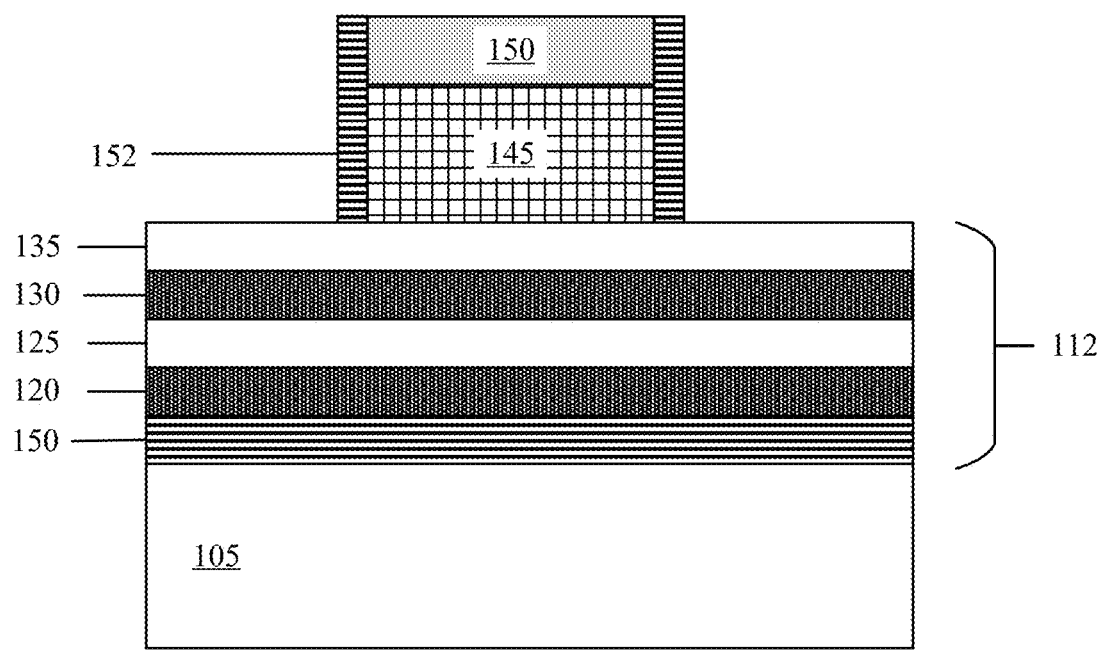
FIG. 7 illustrates cross section $C_1$ and $C_2$ of the nano devices after formation of the upper and lower spacer, in accordance with the embodiment of the present invention.

FIG. 6 illustrates cross section $B_1$ and $B_2$ of the nano devices after formation of a lower spacer, in accordance with the embodiment of the present invention. The first sacrificial layer 115 is selectively removed and replaced with a lower spacer 150. FIG. 7 illustrates cross section $C_1$ and $C_2$ of the nano devices after formation of the upper and lower spacer 152, in accordance with the embodiment of the present invention. FIG. 7 illustrates a different perspective illustrating the lower spacer 150 in the nano stack 112 and the upper spacer 152 being located adjacent to the dummy gate 140 and the hard mask 145.

Figure 8:
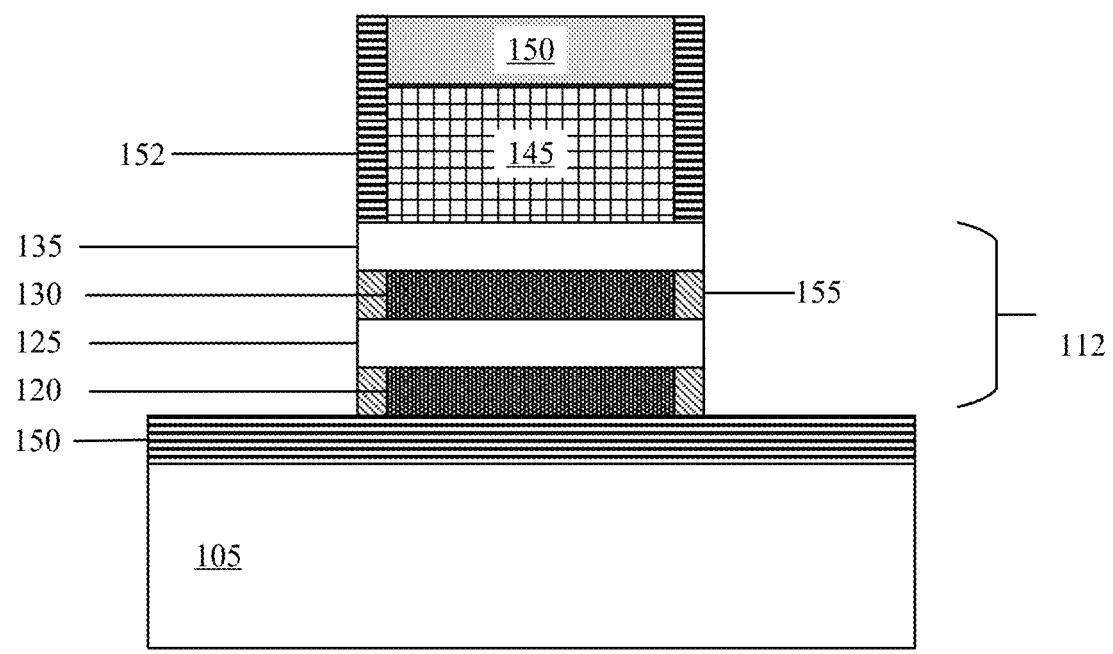
FIG. 8 illustrates cross section $C_1$ and $C_2$ of the nano devices after patterning the nano stack and formation of an inner spacer, in accordance with the embodiment of the present invention.

FIG. 8 illustrates cross section $C_1$ and $C_2$ of the nano devices after patterning the nano stack and formation of an inner spacer 155, in accordance with the embodiment of the present invention. The second layer 120, the third layer 125, the fourth layer 130, and the fifth layer 138 is etched based on the pattern of the upper spacer 152, the dummy gate 140, and the hard mask 145. The second layer 120 and the fourth layer 130 are etched back to create recesses. The recesses are filled with an inner spacer 155.

Figure 9:
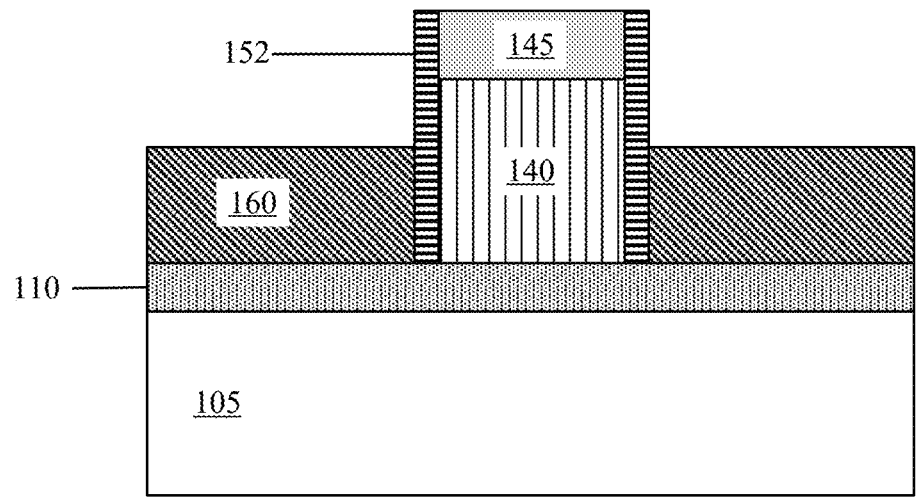
FIG. 9 illustrates cross section A of the nano devices after formation of a source/drain, in accordance with the embodiment of the present invention.

FIG. 9 illustrates cross section A of the nano devices after formation of a source/drain 160, in accordance with the embodiment of the present invention. A source/drain 160 is epitaxially grown on top of the shallow trench isolation layer 110 adjacent to the upper spacer 152. The source/drain 160 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (TI) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 10:
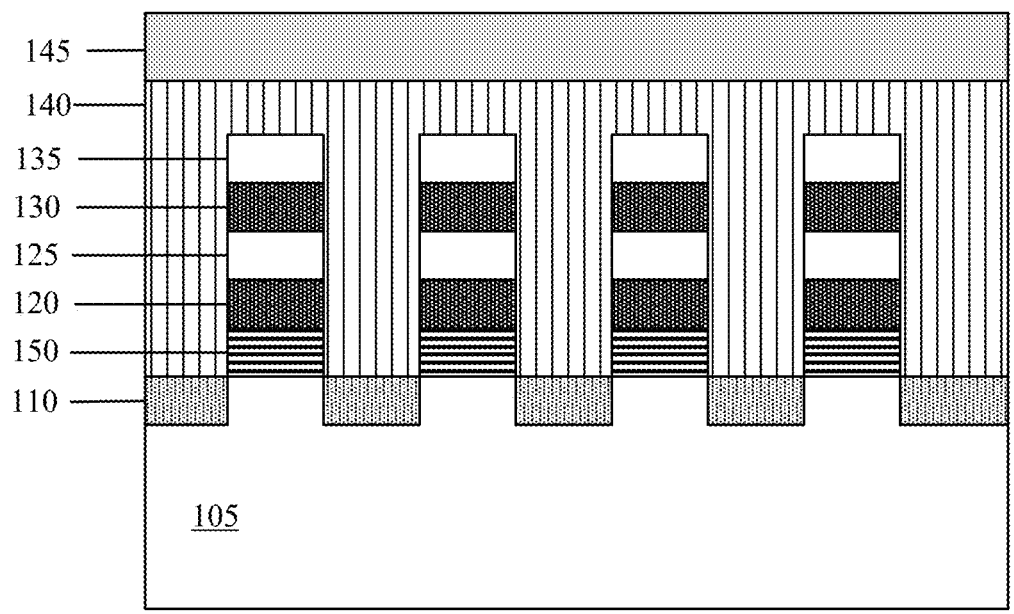
FIG. 10 illustrates cross section $B_1$ and $B_2$ of the nano devices after formation of a source/drain, in accordance with the embodiment of the present invention.
Figure 11:
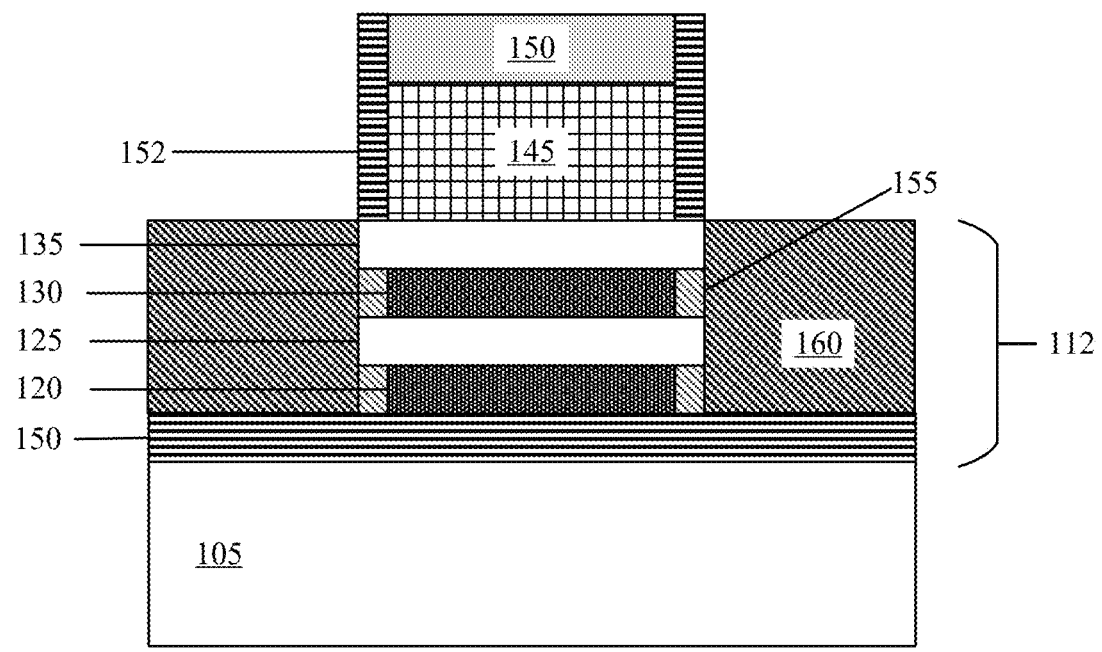
FIG. 11 illustrates cross section $C_1$ and $C_2$ of the nano devices after formation of a source/drain, in accordance with the embodiment of the present invention.

FIG. 10 illustrates cross section $B_1$ and $B_2$ of the nano devices after formation of a source/drain, in accordance with the embodiment of the present invention. FIG. 11 illustrates cross section $C_1$ and $C_2$ of the nano devices after formation of a source/drain, in accordance with the embodiment of the present invention. The source/drain 160 is located on top of the lower spacer 150 and adjacent to the sidewalls of the inner spacer 155, the third layer 125, and the fifth layer 135.

Figure 12:
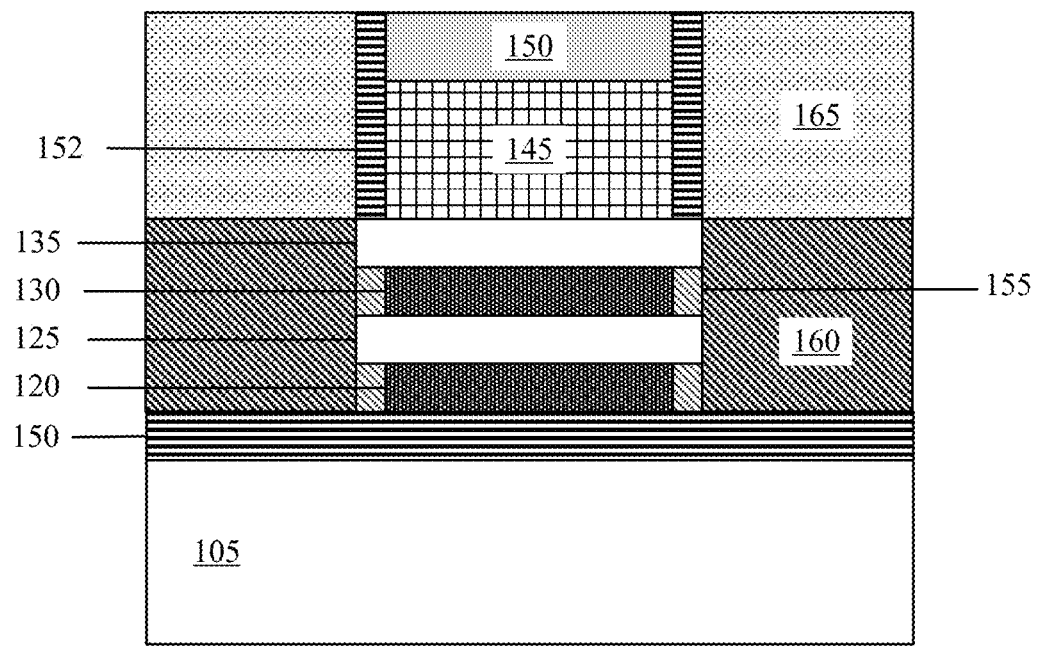
FIG. 12 illustrates cross section $B_1$ of the nanosheet device, in accordance with the embodiment of the present invention.
Figure 13:
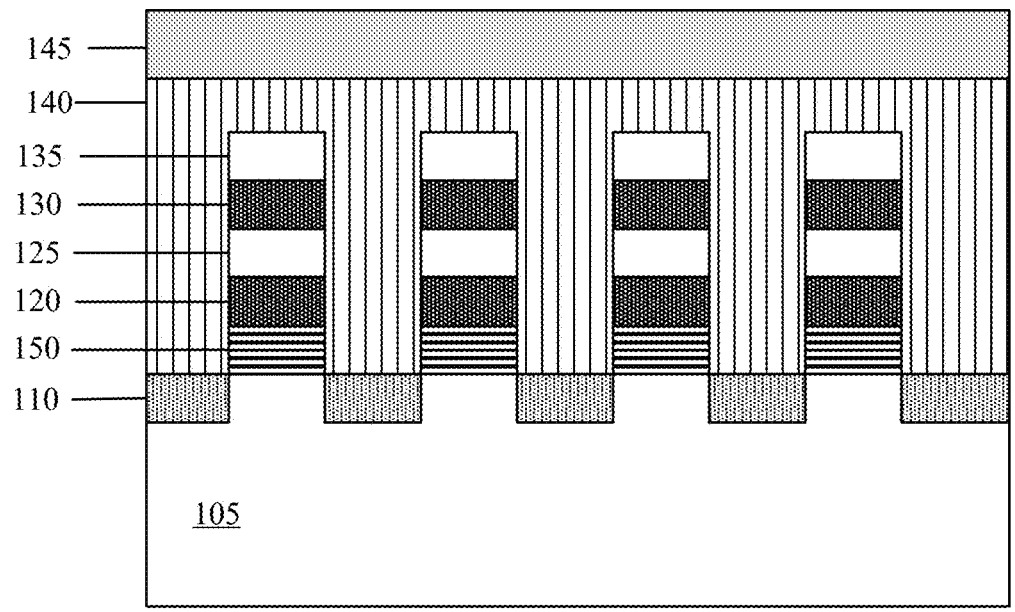
FIG. 13 illustrates cross section $C_1$ of the nanosheet device, in accordance with the embodiment of the present invention.

FIG. 12 illustrates cross section $B_1$ of the nanosheet device, in accordance with the embodiment of the present invention. FIG. 13 illustrates cross section $C_1$ of the nanosheet device, in accordance with the embodiment of the present invention. At this point the processing of the nanosheet device and Fin device diverge from common processing steps. A first dielectric layer 165 is located on top of the source/drain 160. The first dielectric layer 165 is located adjacent to the upper spacer 152.

Figure 14:
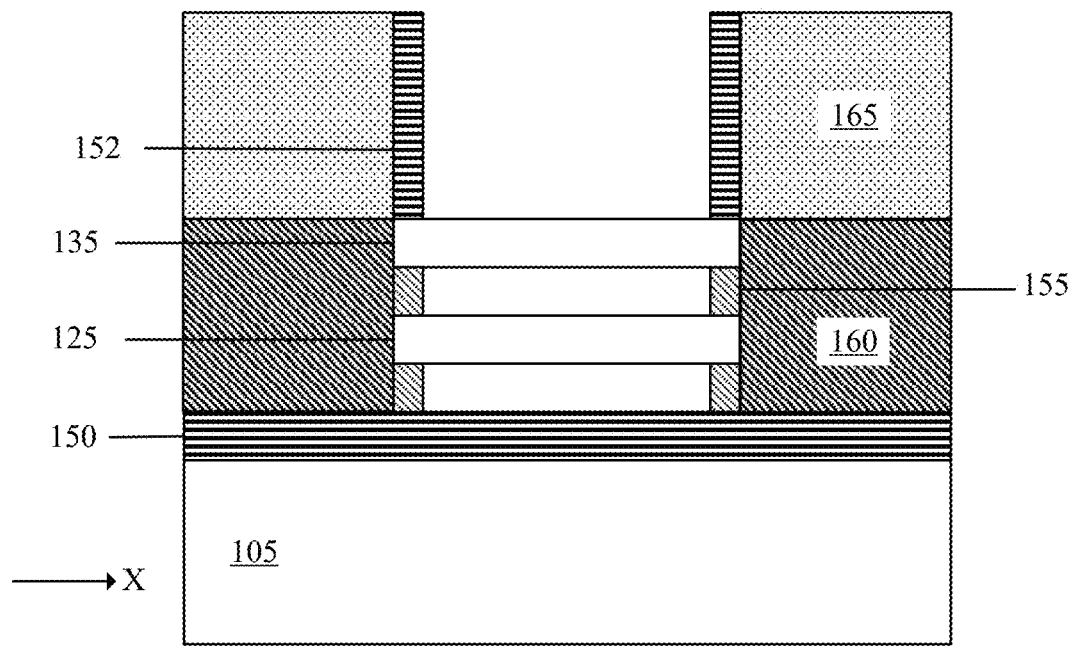
FIG. 14 illustrates cross section $B_2$ of the Fin device after removal of some layers, in accordance with the embodiment of the present invention.
Figure 15:
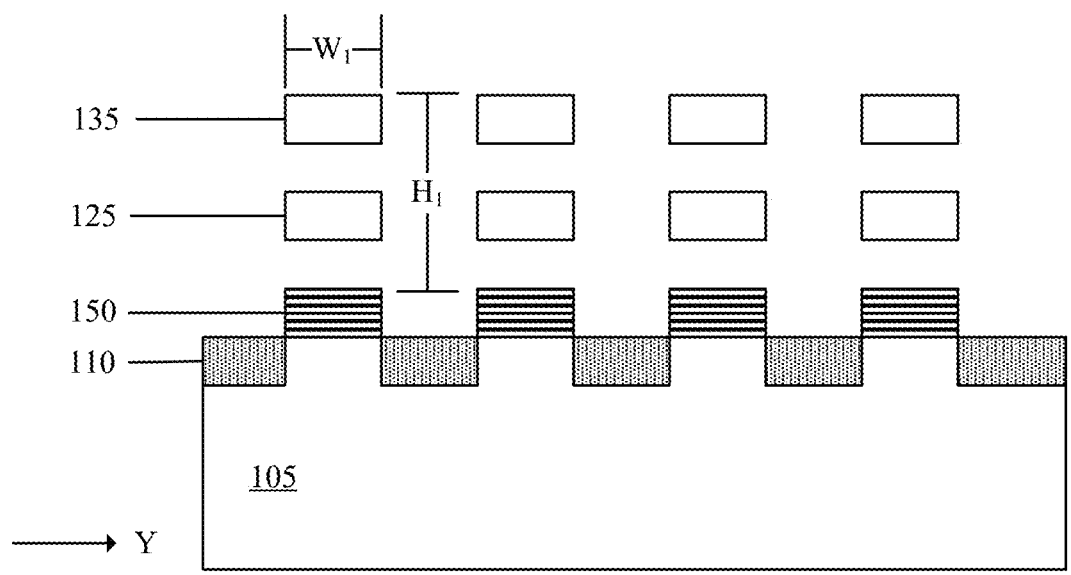
FIG. 15 illustrates cross section $C_2$ of the Fin device after removal of some layers, in accordance with the embodiment of the present invention.

FIG. 14 illustrates cross section $B_2$ of the Fin device after removal of some layers, in accordance with the embodiment of the present invention. The second layer 120, the fourth layer 130, the dummy gate 140, and the hard mask 145 are removed. FIG. 15 illustrates cross section $C_2$ of the Fin device after removal of some layers, in accordance with the embodiment of the present invention. The third layer 125 and the fifth layer 135 have a width $W_1$ as illustrated by FIG. 15. At this stage, the width $W_1$ is the same between the Fin section and the nanosheet section on the substrate 105. The height $H_1$ is the distance between the top surface of the lower spacer 150 and the top surface of the fifth layer 135. At this stage, the height $H_1$ is the same between the Fin section and the nanosheet section on the substrate 105. At this point in the processing, the removal of the second layer 120, the fourth layer 130, the dummy gate 140, and the hard mask 145 did not occur in the nanosheet section.

Figure 16:
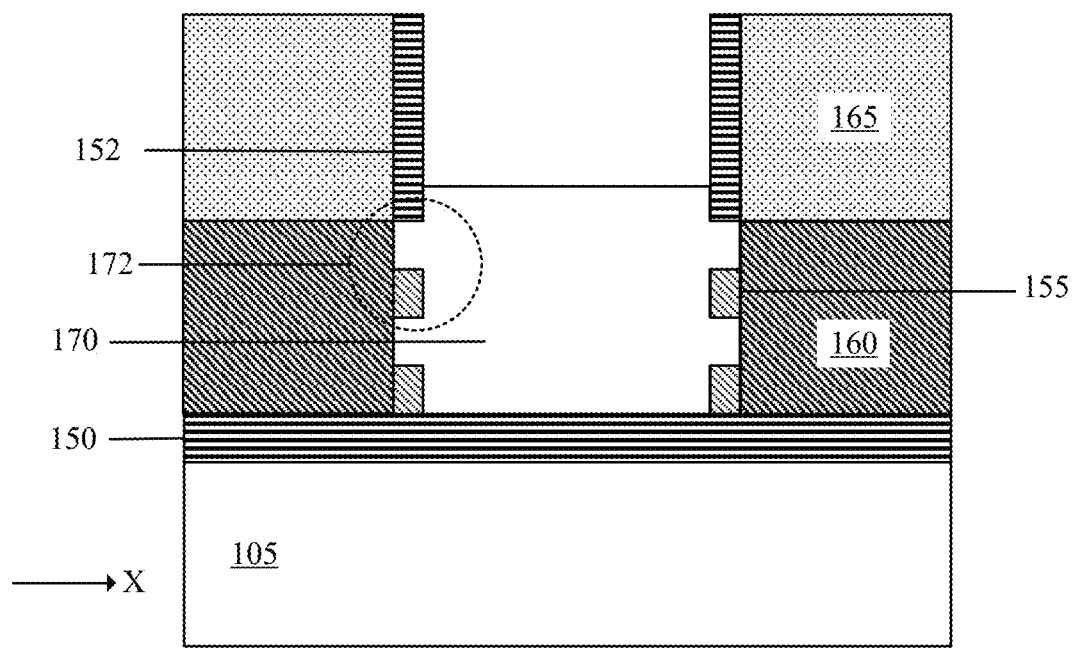
FIG. 16 illustrates cross section $B_2$ of the Fin device after epitaxially growing the layers to form one layer, in accordance with the embodiment of the present invention.

FIG. 16 illustrates cross section $B_2$ of the Fin device after epitaxially growing the layers to form one layer, in accordance with the embodiment of the present invention. The third layer 125 and the fifth layer 135 are comprised of, for example, Si. By epitaxially growing the material of the third layer 125 and the fifth layer 135 will cause these layers to be combined/merged into a combined fin 170. The shape of the combined fin 170 is affected by the inner spacer 155, so if the inner spacer 155 is not removed, then the combined fin 170 will have a puzzle piece shape. The puzzle piece shape of the combined fin 170 will have protrusions and recessed areas, as emphasized by dashed circle 172. When the inner spacer 155 is removed prior to the epitaxially growing stage, then the combined fin 170 will not have the puzzle shape (not shown). However, in both scenarios the height of the top surface of the combined fin 170 is higher than the top surface of the fifth layer 135.

Figure 17:
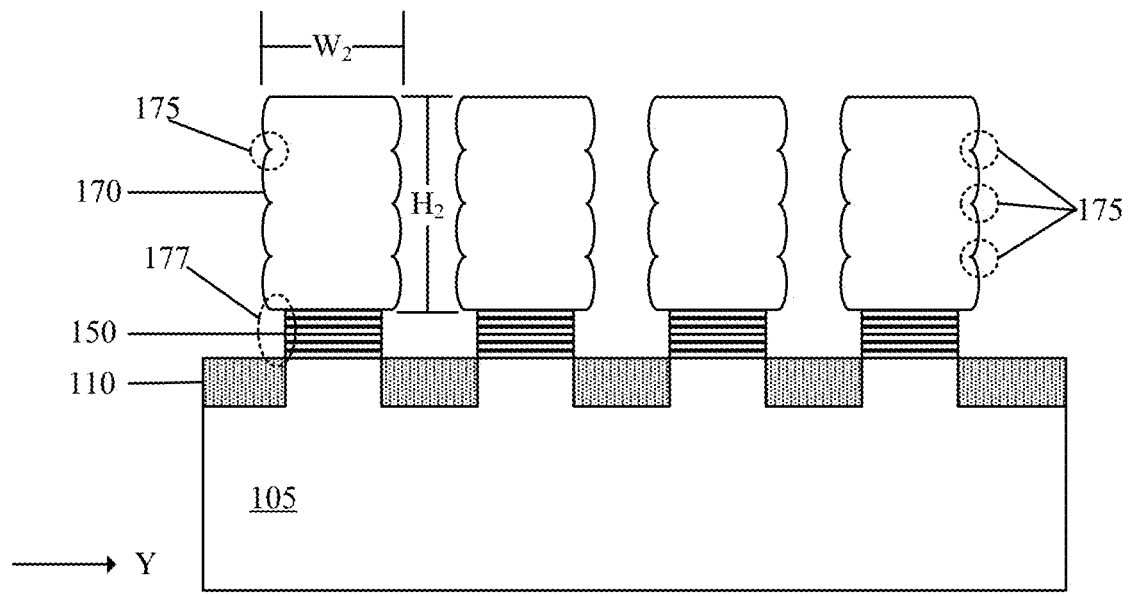
FIG. 17 illustrates cross section $C_2$ of the Fin device after epitaxially growing the layers to form one layer, in accordance with the embodiment of the present invention.

FIG. 17 illustrates cross section $C_2$ of the Fin device after epitaxially growing the layers to form one layer, in accordance with the embodiment of the present invention. By epitaxially growing the material of the third layer 125 and the fifth layer 135 will cause these layers to be combined/merged into a combined fin 170. The combined fin 170 has a width $W_2$ and a height $H_2$. The width $W_2$ and the height $H_2$ is greater than the width $W_1$ and the height $H_1$, respectively. The reason why the width $W_2$ and height $H_2$ is greater is because the epitaxially growing of the layers adds material to the width and height. The width $W_1$ of the nanosheets (i.e., the third layer 125 and the fifth layer 135) is equal to the width of the lower spacer 150. The width $W_2$ of the combined fin 170 is greater than the width of the lower spacer 150. Therefore, the combined fin 170 creates a gap or space between the bottom surface of the combined fin 170 and the top surface of the shallow trench isolation layer 110, as illustrated by dashed circle 177. This gap or space, i.e., dashed circle 177, will allow for material to be deposited below portions of the combined fin 170 and adjacent to the lower spacer 150. Furthermore, the combined fin 170 will not have a uniform/flush sidewall. The epitaxially growing of the third layer 125 and the fifth layer 135 will leave depressions or recesses in the sidewall after these layers are merged. Depressions or recess, as illustrated by dashed circle 175, will form at the edge of the third layer 125 and the fifth layer 135 because these layers are growing wider as the material is being added to merge them.

Figure 18:
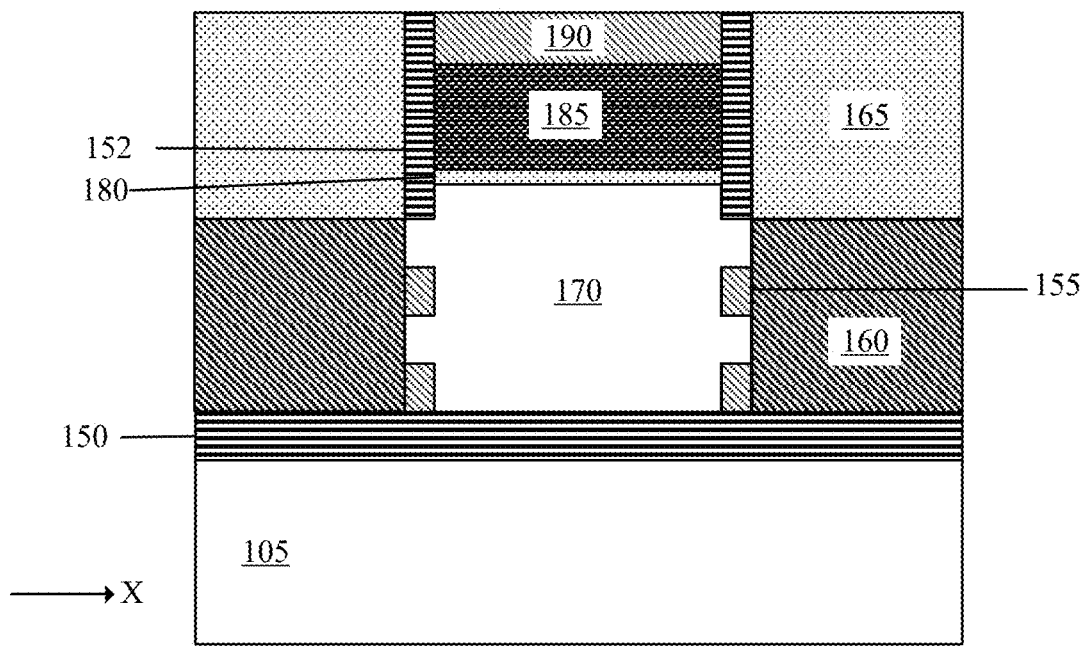
FIG. 18 illustrates cross section $B_2$ of the Fin device after formation of the gate, in accordance with the embodiment of the present invention.

FIG. 18 illustrates cross section $B_2$ of the Fin device after formation of the gate 185, in accordance with the embodiment of the present invention. A gate oxide liner 180 is formed on the exposed top surface of the combined fin 170. A gate 185 is formed on top of the gate oxide liner 180 between sections of the upper spacer 152. The gate 185 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A gate cap 190 is formed on top of the gate 185 between sections of the upper spacer 152. In this embodiment, the gate 185 is first formed in the fin section but not in the nanosheet section. That gate 185 can be comprised of different material in the fin section and the nanosheet section since the gate 185 is not formed at the same time in the fin section and in the nanosheet section. FIG. 18 illustrates that the combined fin 170 has a first shape along the X-axis of the fin nanodevice. It is also possible to from gate 185 on FINFET and Nanosheet at the same time, in which case the gate 185 will be the same between FINFET and Nanosheet devices.

Figure 19:
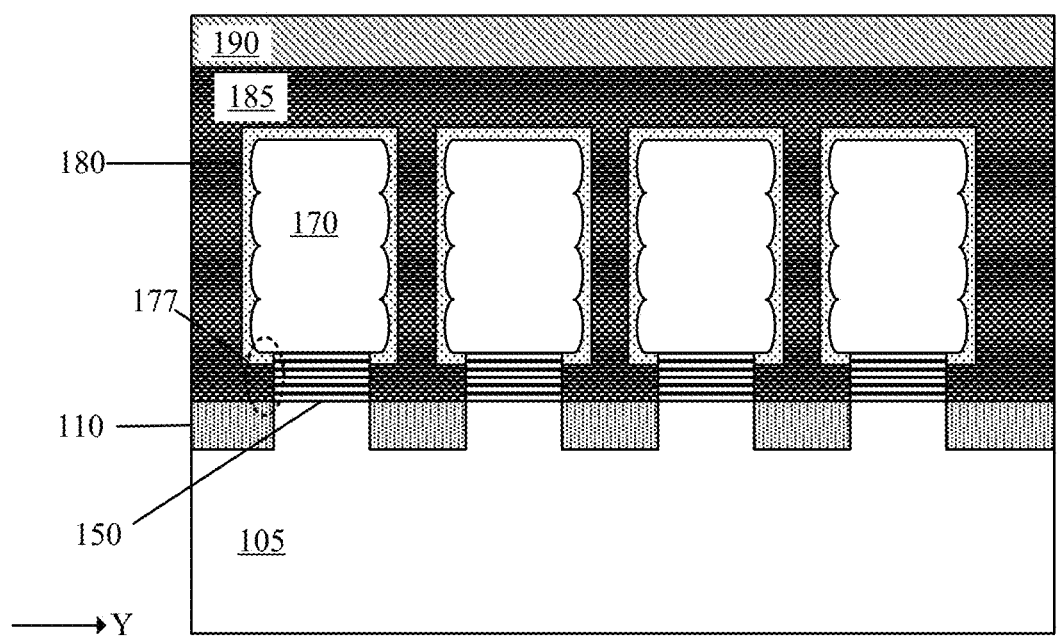
FIG. 19 illustrates cross section $C_2$ of the Fin device after formation of the gate, in accordance with the embodiment of the present invention.

FIG. 19 illustrates cross section $C_2$ of the Fin device after formation of the gate 185, in accordance with the embodiment of the present invention. The gate oxide liner 180 is formed on the exposed surfaces (i.e., the top surface, the sidewalls, and the bottom surface) of the combined fin 170. The gate 185 is formed all around the gate oxide liner 180 to enclose each of the combined fins 170. The gate 185 is in direct contact with the shallow trench isolation layer 110, the lower spacer 150, and the gate oxide liner 180. The gate 185 is located beneath the bottom surface of the combined fin 170 in the location of dashed circle 177. FIG. 19 illustrates that the combined fin 170 has a second shape along the Y-axis of the fin nanodevice. The first shape of the combined fin 170, as illustrated by FIG. 18, is different than the second shape of the combined fin 170, as illustrated by FIG. 19.

Figure 20:
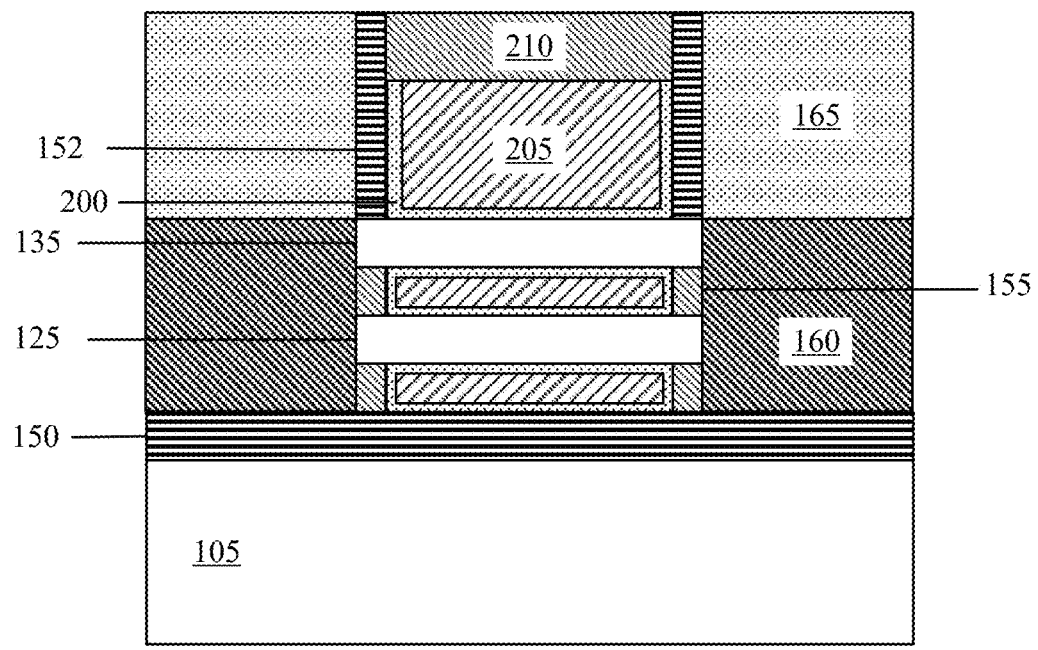
FIG. 20 illustrates cross section $B_1$ of the nanosheet device after formation of a gate, in accordance with the embodiment of the present invention.
Figure 21:
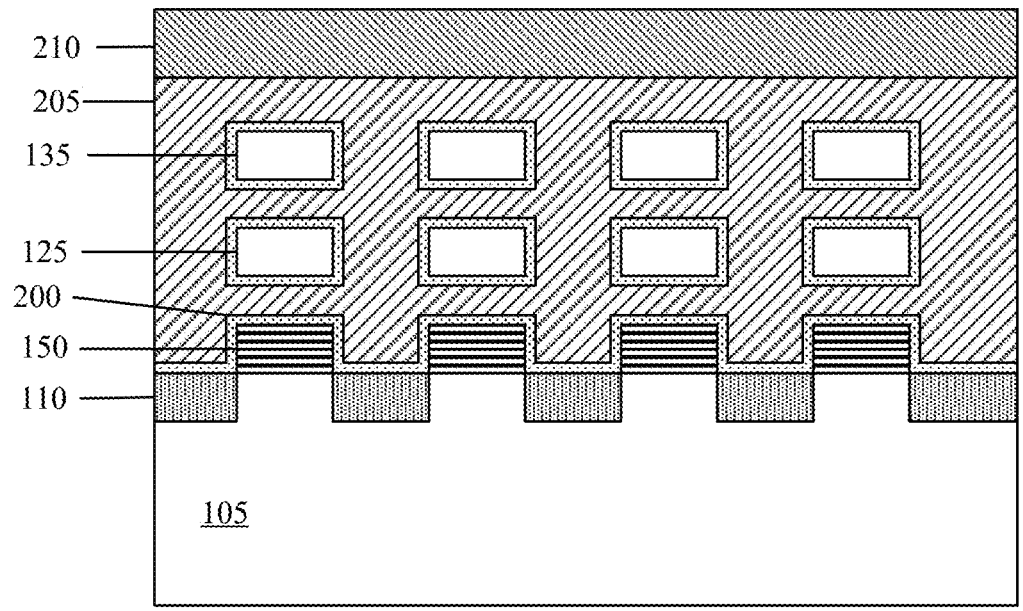
FIG. 21 illustrates cross section $C_1$ of the nanosheet device after formation of a gate, in accordance with the embodiment of the present invention.

FIG. 20 illustrates cross section $B_1$ of the nanosheet device after formation of a gate 205, in accordance with the embodiment of the present invention. In an accordance to an embodiment where the gate 205 was formed on the nanosheet device after the fin device. Gate 205 is different than gate 185 in this embodiment but can also be the same if the gate on Nanosheet and FINFET are formed at the same time. The dummy gate 140, the hard mask 145, the second layer 120, and the fourth layer 130 are removed. A gate oxide liner 200 is formed on the exposed surfaces of the inner spacer 155, the lower spacer 150, the third layer 125, the fifth layer 135, and the upper spacer 152. The gate oxide liner 200 for Nanosheet is usually thinner than gate oxide liner 180 for FINFET. The gate 205 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A gate cap 210 is formed on top of the gate 205 between sections of the upper spacer 152. FIG. 21 illustrates cross section $C_1$ of the nanosheet device after formation of a gate 205, in accordance with the embodiment of the present invention. The gate oxide liner 200 is formed on the exposed surfaces of the shallow trench isolation layer 110, the lower spacer 150, the third layer 125, and the fifth layer 135. The gate 205 is formed all around the nanosheets (the third layer 125, and the fifth layer 135).

Figure 22:
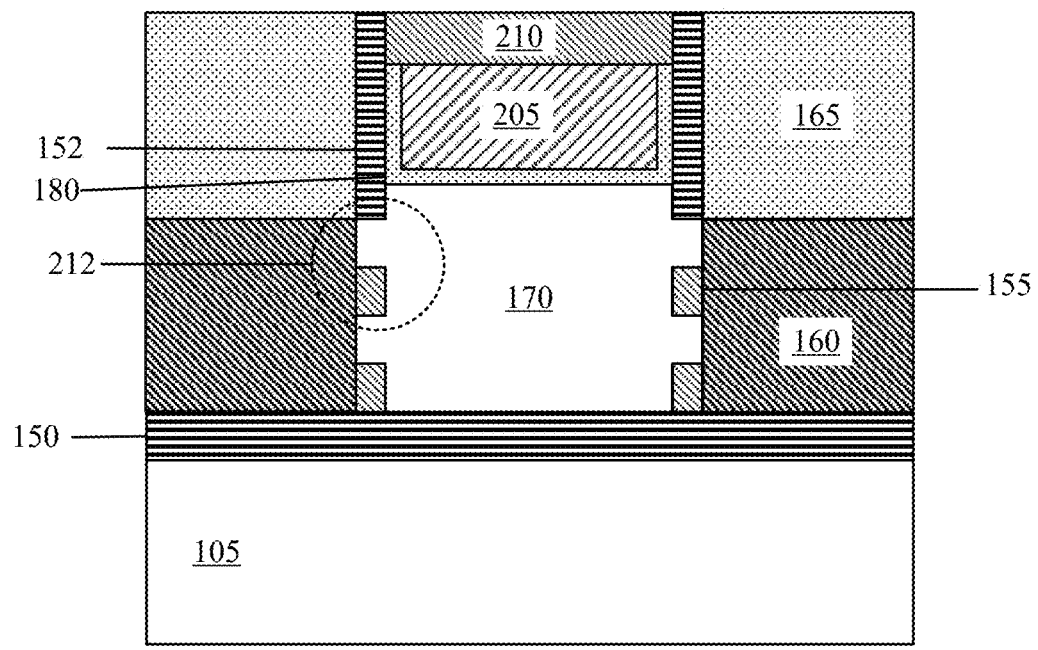
FIG. 22 illustrates cross section $B_2$ of the Fin device after formation of a gate, in accordance with the embodiment of the present invention.

FIG. 22 illustrates cross section $B_2$ of the Fin device after formation of a gate 205, in accordance with the embodiment of the present invention. A gate oxide liner 180 is formed on top of the combined fin 170 and along the sidewalls of the upper spacer 152. A gate 205 is formed on top of the gate oxide liner 180 and a gate cap 210 is formed on top of the gate 205. A difference between the fin device as illustrated by FIG. 18 and the fin device as illustrated by FIG. 22, the gate 205 is located on top of the combined fin 170. The gate 205 can be comprised of the same material for the nanosheet device and the fin device.

Figure 23:
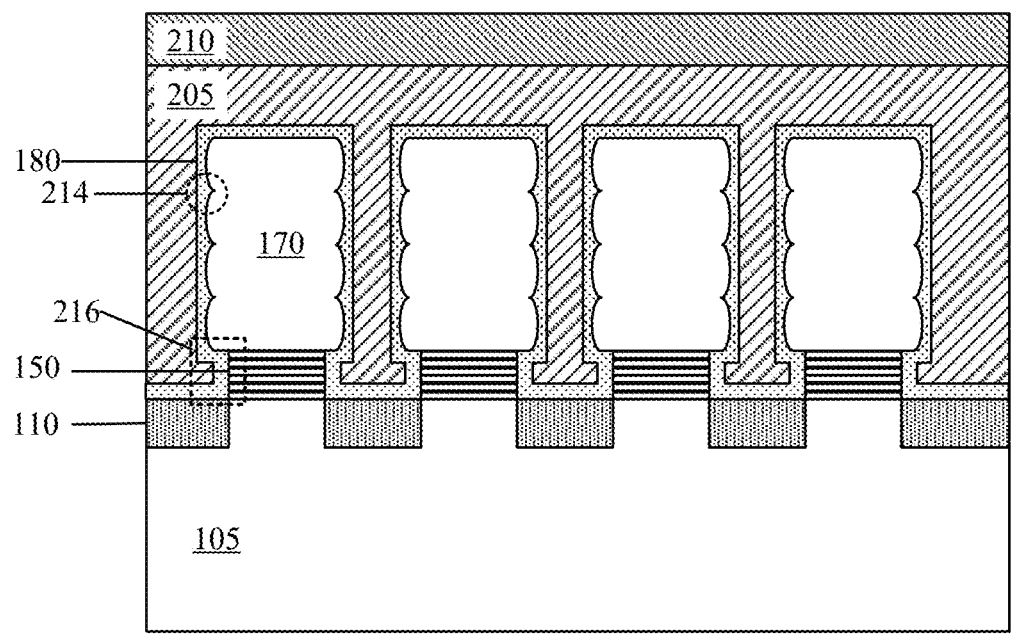
FIG. 23 illustrates cross section $C_2$ of the Fin device after formation of a gate, in accordance with the embodiment of the present invention.

FIG. 23 illustrates cross section $C_2$ of the Fin device after formation of a gate, in accordance with the embodiment of the present invention. The gate oxide liner 180 is formed on the exposed surfaces (i.e., the top surface, the sidewalls, and the bottom surface) of the combined fin 170, the lower spacer 150 and the shallow trench isolation layer 110. The gate 205 is formed all around the gate oxide liner 180 to enclose each of the combined fins 170. The gate 205 is located beneath the bottom surface of the combine fin 170 in the location of dashed square 216.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor device comprising:
   a first spacer located on top of a substrate, wherein the first spacer has a first width in a first axis of a nanodevice; and
   at least one fin located on top of the first spacer, wherein the at least one fin has a second width in the first axis of the nanodevice, wherein the second width is larger than the first width, wherein the at least one fin has a first shape in the first axis of the nanodevice, wherein the at least one fin has a second shape in a second axis of the nanodevice, wherein the first shape and the second shape are different.

2. The semiconductor device of claim 1, further comprising:
   a gate located on top of the substrate, wherein the gate is located around at least four surfaces of the at least one fin.

3. The semiconductor device of claim 1, further comprising:
   a gate located on top of the substrate, wherein the gate is located below a bottom surface of the at least one fin.

4. The semiconductor device of claim 3, further comprising:
   a liner located around the at least one fin in the first axis of the nanodevice.

5. The semiconductor device of claim 4, wherein the liner is in direct contact with the bottom surface of the at least one fin, wherein the gate is in direct contact with the liner located below the bottom surface of the at least one fin.

6. The semiconductor device of claim 1, wherein a sidewall surface of the at least one fin in the first axis of the nanodevice is not uniform.

7. The semiconductor device of claim 6, wherein the sidewall surface of the at least one fin includes a plurality of recesses.

8. The semiconductor device of claim 1, further comprising:
   an inner spacer located within a recess of the at least one fin.

9. The semiconductor device of claim 8, further comprising:
   a source/drain located adjacent to a sidewall of the at least one fin and the inner spacer along a second axis of the nanodevice.

10. A semiconductor device comprising:
    a first nanodevice comprised of a plurality of nanosheets located on a substrate, wherein each of the plurality of nanosheets has a first width along a first axis;
    a second nanodevice comprised of at least one fin located on the substrate, wherein the at least one fin has a second width along the first axis, wherein the second width is larger than the first width; and
    a spacer is located between the at least one fin and the substrate and the spacer is located between the plurality of nanosheets and the substrate.

11. The semiconductor device of claim 10, further comprising:
    a first spacer located on top of the substrate, wherein the first spacer has a third width along a first axis, wherein the second width is larger than the third width, wherein the third width is substantial equal to the first width.

12. The semiconductor device of claim 11, further comprising:

a liner located around the at least one fin in the first axis.

13. The semiconductor device of claim 12, wherein the liner is in direct contact with a bottom surface of the at least one fin, wherein a first gate is in direct contact with the liner located below the bottom surface of the at least one fin.

14. The semiconductor device of claim 10, further comprising:
a first gate located on top of the substrate, wherein the first gate is located around at least four surfaces of the at least one fin, wherein the first gate is comprised of a first material;
a second gate located on top of the substrate, wherein the second gate is located around the plurality of nanosheets, wherein the second gate is comprised of a second material.

15. The semiconductor device of claim 10, wherein a sidewall surface of the at least one fin in the first axis is not uniform, wherein the sidewall surface of the at least one fin includes a plurality of recesses.

16. The semiconductor device of claim 10, wherein the at least one fin has a first shape in the first axis, wherein the at least one fin has a second shape in a second axis, wherein the first shape and the second shape are different.

17. A method comprising:
forming alternating layers of sacrificial material and channel material located on top of a substrate, wherein a first sacrificial layer is located directly on top of the substrate;
removing the first sacrificial layer and forming a bottom spacer located directly on top of the substrate and below the alternating layers;
etching the alternating layers and the bottom spacer to a first width along a first axis;
removing the alternating layers comprised of the sacrificial material; and
epitaxially growing the layers of the alternating layers comprised of the channel material to merger the layers of the alternating layers comprised of the channel material to form a combine fin, wherein the fin has a second width along the first axis, wherein the second width is larger than the first width.

18. The method of claim 17, further comprising:
forming a liner located around the combined fin in the first axis.

19. The method of claim 18, further comprising:
forming a gate around the liner, wherein the liner is in direct contact with a bottom surface of the at least one fin, wherein a gate is in direct contact with the liner located below the bottom surface of the at least one fin.

* * * * *